United States Patent
Butz et al.

(10) Patent No.: US 7,291,251 B2
(45) Date of Patent: Nov. 6, 2007

(54) METHOD OF MAKING COATED ARTICLE WITH IR REFLECTING LAYER(S) USING KRYPTON GAS

(75) Inventors: Jochen Butz, Wolfen (DE); Uwe Kriltz, Jena (DE); Sebastian Bobrowski, Jaworzno (PL)

(73) Assignee: Centre Luxembourgeois de Recherches pour le Verre et la Ceramique S.A. (C.R.V.C.), Grand Duche de Luxembourg ( * ) Notice: Subject to any disclaimer, the term of this patent is extended or adjusted under 35 U.S.C. 154(b) by 214 days.

(21) Appl. No.: 11/036,187

(22) Filed: Jan. 18, 2005

(65) Prior Publication Data

US 2006/0083934 A1    Apr. 20, 2006

Related U.S. Application Data

(63) Continuation-in-part of application No. 10/981,745, filed on Nov. 5, 2004.

(60) Provisional application No. 60/625,164, filed on Nov. 5, 2004, provisional application No. 60/619,687, filed on Oct. 19, 2004.

(51) Int. Cl.
   *C23C 14/35*    (2006.01)
(52) U.S. Cl. .......................... 204/192.17; 204/192.26; 204/192.28; 204/192.15
(58) Field of Classification Search .......... 204/192.26, 204/192.27, 192.28, 192.12, 192.15
See application file for complete search history.

(56) References Cited

U.S. PATENT DOCUMENTS 5,279,722 A * 1/1994 Szczyrbowski et al. ............................................................ 204/192.27
5,344,718 A    9/1994 Hartig et al.
5,514,476 A    5/1996 Hartig et al.
5,552,180 A    9/1996 Finley et al.
5,770,321 A    6/1998 Hartig et al.
5,798,860 A    8/1998 Yu et al.
5,800,933 A    9/1998 Hartig et al.
5,834,103 A   11/1998 Bond et al.
5,948,538 A    9/1999 Brochot et al.

(Continued)

FOREIGN PATENT DOCUMENTS

JP    04-251453    9/1992

(Continued)

OTHER PUBLICATIONS

Vergohl et al. "Optimization of the reflectivity of magnetron sputter deposited silver film", J. Vac. Sci. Technol. A 18(4), Jul./Aug. 2000, pp. 1632-1637.*

(Continued)

*Primary Examiner*—Rodney G. McDonald
(74) *Attorney, Agent, or Firm*—Nixon & Vanderhye P.C.

(57) ABSTRACT

A method of making a coated article is provided, where the coated article may be used in a window or the like and may have at least one infrared (IR) reflecting layer in a low-E coating. The IR reflecting layer may be of silver or the like. In certain example embodiments, at least krypton (Kr) gas is used in sputter-depositing a silver inclusive IR reflecting layer. It has been found that the use of Kr gas in sputtering Ag targets results in an IR reflecting layer having improved resistance and emittance properties.

16 Claims, 6 Drawing Sheets

Dependence of Emissivity on Krypton and total gas flow during silver sputtering.

U.S. PATENT DOCUMENTS

| | | |
|---|---|---|
| 6,287,675 B1 | 9/2001 | Guiselin et al. |
| 6,398,925 B1 | 6/2002 | Arbab et al. |
| 6,524,714 B1 | 2/2003 | Neuman et al. |
| 6,541,084 B2 | 4/2003 | Wang |
| 6,572,940 B1 | 6/2003 | Noethe et al. |
| 6,576,349 B2 | 6/2003 | Lingle et al. |
| 6,582,809 B2 | 6/2003 | Boire et al. |
| 6,589,658 B1 | 7/2003 | Stachowiak |
| 6,602,587 B2 | 8/2003 | Macquart et al. |
| 6,632,491 B1 * | 10/2003 | Thomsen et al. .............. 428/34 |
| 6,667,121 B2 | 12/2003 | Wang |
| 6,673,427 B2 | 1/2004 | Guiselin et al. |
| 6,686,050 B2 | 2/2004 | Lingle et al. |
| 6,692,831 B2 | 2/2004 | Stachowiak |
| 6,723,211 B2 | 4/2004 | Lingle et al. |
| 6,749,941 B2 | 6/2004 | Lingle |
| 6,777,030 B2 | 8/2004 | Veerasamy et al. |
| 6,781,718 B2 | 8/2004 | Lingle et al. |
| 6,787,005 B2 | 9/2004 | Laird et al. |
| 6,802,943 B2 | 10/2004 | Stachowiak |
| 6,830,817 B2 | 12/2004 | Stachowiak |
| 2003/0150711 A1 | 8/2003 | Laird |
| 2004/0229073 A1 | 11/2004 | Dietrich et al. |

FOREIGN PATENT DOCUMENTS

| | | |
|---|---|---|
| WO | WO 01/73153 A1 * | 10/2001 |
| WO | WO 01/74153 | 10/2001 |
| WO | WO 03/055816 * | 7/2003 |

OTHER PUBLICATIONS

XP-002169824, "Preparation Optical Information Record Medium High Reflect sputter Gold Alloy Thin Layer Colour Layer Forming Polycarbonate Substrate", DERWENT 1992 Abstract.

XP-001002892, "Krypton Bubble Formation and Growth in Sputtered Gold", Patten et al., Thin Solid Films, 72 (1980) pp. 3691-3672.

U.S. Appl. No. 10/981,745, filed Nov. 5, 2004.
U.S. Appl. No. 60/619,687, filed Oct. 19, 2004.
U.S. Appl. No. 60/625,164, filed Nov. 5, 2004.
US 4,960,645, 10/1990, Lingle et al. (withdrawn)

* cited by examiner

Fig. 3   Effect of Krypton and total gas flow in silver sputter bay on Emissivity.

Fig. 4 Dependence of Emissivity on Krypton and total gas flow during silver sputtering.

| Run # | Total Silver Flow | Ar/Kr Gas mix (Kr %) | Ar Flow | Kr Flow | ZnO Lambda Setting | Tin Present | Lite # | Yf 2IC | L* f 2IC | a* f 2IC | b* f 2IC | Rs S&T Resistance | Silver Thickness | S&T Specific Resistance (ohm.cm) | S&T Emissivity |
|---|---|---|---|---|---|---|---|---|---|---|---|---|---|---|---|
| 1.0 | 250 | 0 | 250 | 0 | 337 | Yes | 15158 | 3.94 | 23.46 | 2.69 | -3.75 | 3.96 | 109.0 | 4.32E-06 | 7.0 |
| 1.1 | 150 | 0 | 150 | 0 | 332 | Yes | 15183 | | | | | 3.81 | 110.4 | 4.21E-06 | 6.4 |
| 1.2 | 350 | 0 | 350 | 0 | 332 | Yes | 15186 | 3.89 | 23.31 | 3.64 | -3.71 | 3.65 | 115.4 | 4.21E-06 | 6.7 |
| 1.3 | 350 | 100 | 0 | 350 | 332 | Yes | 15168 | 4.01 | 23.71 | 5.90 | -4.26 | 3.14 | 118.3 | 3.71E-06 | 6.2 |
| 1.4 | 150 | 100 | 0 | 150 | 332 | Yes | 15171 | 4.27 | 24.56 | 7.67 | -5.01 | 2.92 | | | 6.0 |
| 1.5 | 150 | 0 | 150 | 0 | 332 | Yes | 15177 | 3.91 | 23.37 | 2.44 | -4.16 | 3.89 | 111.3 | 4.33E-06 | 6.0 |
| 1.6 | 150 | 0 | 150 | 0 | 342 | Yes | 15189 | 3.89 | 23.32 | 3.98 | -3.47 | 3.80 | | | 7.1 |
| 1.7 | 150 | 100 | 0 | 150 | 342 | Yes | 15192 | 4.27 | 24.54 | 8.77 | -5.76 | 3.06 | 114.3 | 3.50E-06 | 5.7 |
| 1.8 | 350 | 100 | 0 | 350 | 342 | Yes | 15195 | 4.06 | 23.86 | 7.08 | -5.23 | 3.21 | 117.1 | 3.76E-06 | 6.3 |
| 1.9 | 350 | 0 | 350 | 0 | 342 | Yes | 15198 | 3.92 | 23.40 | 4.80 | -3.90 | 4.11 | 118.0 | 4.85E-06 | 7.2 |
| 1.10 | 250 | 50 | 125 | 125 | 342 | Yes | 15201 | 4.19 | 24.29 | 8.21 | -5.94 | 3.08 | | | 6.0 |
| 1.11 | 250 | 50 | 125 | 125 | 332 | Yes | 15180 | 4.18 | 24.27 | 7.18 | -4.71 | 3.02 | 119.1 | 3.60E-06 | 5.5 |
| 1.12 | 250 | 50 | 125 | 125 | 337 | Yes | 15204 | 4.17 | 24.21 | 7.71 | -4.78 | 3.14 | 122.7 | 3.85E-06 | 5.4 |
| 1.13 | 250 | 100 | 0 | 250 | 337 | Yes | 15207 | 4.13 | 24.09 | 7.48 | -4.27 | 3.00 | 123.1 | 3.69E-06 | 5.9 |
| 1.14 | 250 | 0 | 250 | 0 | 337 | Yes | 15210 | 3.89 | 23.29 | 3.87 | -3.88 | 3.97 | | | 6.9 |
| 1.15 | 250 | 100 | 0 | 250 | 337 | Yes | 15213 | 4.14 | 24.13 | 7.35 | -4.99 | 3.01 | 118.3 | 3.56E-06 | 6.0 |
| 1.16 | 250 | 50 | 125 | 125 | 332 | Yes | 15216 | 4.24 | 24.45 | 7.54 | -4.41 | 3.04 | 122.1 | 3.71E-06 | 5.1 |
| 1.17 | 350 | 50 | 175 | 175 | 337 | Yes | 15219 | 4.21 | 24.34 | 7.21 | -4.27 | 3.11 | 115.8 | 3.60E-06 | 5.3 |
| 1.18 | 150 | 50 | 75 | 75 | 337 | Yes | 15222 | 4.19 | 24.29 | 7.92 | -4.21 | 3.02 | 124.1 | 3.75E-06 | 6.2 |
| 2.1 | 250 | 0 | 250 | 0 | 337 | No | 15259 | 6.32 | 30.20 | 3.74 | -5.00 | 2.87 | 128.5 | 3.69E-06 | 4.8 |
| 2.2 | 350 | 100 | 0 | 350 | 342 | No | 15228 | | | | | 3.05 | | | 6.2 |
| 2.3 | 150 | 100 | 0 | 150 | 342 | No | 15231 | 6.27 | 30.09 | 3.95 | -5.05 | 2.91 | 129.7 | 3.77E-06 | 5.6 |
| 2.4 | 350 | 100 | 0 | 350 | 332 | No | 15235 | 6.11 | 29.70 | 2.43 | -5.58 | 3.02 | 134.5 | 4.06E-06 | 6.0 |
| 2.5 | 350 | 100 | 0 | 350 | 342 | No | 15238 | | | | | 3.01 | | | 6.0 |
| 2.6 | 150 | 100 | 0 | 150 | 332 | No | 15241 | 6.69 | 31.08 | 3.25 | -5.34 | 2.89 | 128.8 | 3.72E-06 | 5.7 |
| 2.7 | 150 | 100 | 0 | 150 | 342 | No | 15244 | 6.23 | 29.97 | -0.55 | -6.47 | 3.65 | 111.4 | 4.06E-06 | 6.7 |
| 2.8 | 350 | 100 | 0 | 350 | 342 | No | 15247 | | | | | 3.70 | | | 6.9 |
| 2.9 | 350 | 100 | 0 | 350 | 332 | No | 15250 | 5.77 | 28.82 | 0.40 | -5.64 | 3.58 | 121.0 | 4.33E-06 | 6.0 |
| 2.10 | 350 | 0 | 350 | 0 | 342 | No | 15253 | 6.21 | 29.94 | 0.55 | -6.35 | 3.50 | | | 6.6 |
| 2.11 | 150 | 0 | 150 | 0 | 332 | No | 15256 | 6.13 | 29.73 | 0.04 | -6.47 | 3.68 | 111.4 | 4.10E-06 | 6.6 |
| 2.12 | 250 | 50 | 125 | 125 | 337 | No | 15262 | 6.30 | 30.16 | 3.40 | -5.17 | 2.94 | 123.7 | 3.64E-06 | 5.8 |

*Fig. 7*

METHOD OF MAKING COATED ARTICLE WITH IR REFLECTING LAYER(S) USING KRYPTON GAS

This application is a continuation-in-part (CIP) of U.S. patent application Ser. No. 10/981,745, filed Nov. 5, 2004 (the disclosure of which is herein incorporated herein by reference); and this application also claims priority on U.S. Provisional Application No. 60/619,687, filed Oct. 19, 2004 and No. 60/625,164, filed Nov. 5, 2004 (the disclosures of all of which are hereby incorporated herein by reference).

This application relates to a coated article including at least one infrared (IR) reflecting layer of a material such as silver or the like. In certain embodiments, the silver based IR reflecting layer is formed by sputtering a target comprising silver in an atmosphere comprising krypton (Kr) gas. Surprisingly, it has been found that the use of krypton gas in the sputtering of silver in such coatings unexpectedly causes emissivity and/or resistance of the coating to decrease in an advantageous manner. Coated articles herein may be used in the context of insulating glass (IG) window units, monolithic window applications, laminated windows, and/or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, desired color, low emissivity (or emittance), low sheet resistance ($R_S$), low U-values in the context of IG window units, and/or low specific resistivity. Desired visible transmission and color may permit coated articles to be used in applications where these characteristics are desired such as in architectural or vehicle window applications, whereas low-emissivity (low-E), low sheet resistance, and low specific resistivity characteristics permit such coated articles to block significant amounts of infrared (IR) radiation so as to reduce for example undesirable heating of vehicle or building interiors.

Thus, it will be appreciated that low emittance values, low sheet resistance ($R_S$) and low specific resistivity are desirable features in many situations. For coated articles having a coating including an IR reflecting layer(s) of Ag or the like, it is the IR reflecting layer(s) that primarily determines the emittance, sheet resistance, and specific resistivity (or resistance) values of the coated article. It is noted that specific resistivity (or resistance) of a particular layer or coating is $R_S$ multiplied by thickness of the IR reflecting layer(s). Specific resistance/resistivity (SR) is thus a good indicator of the quality of an IR reflecting layer; in particular, a better more conductive IR reflecting layer (e.g., silver based layer) has a lower specific resistance.

Consider a typical coated article with the following layer stack. This coated article is suitable for use in an IG (insulation glass) window unit. For the coated article listed below, the coating includes layers that are listed from the glass substrate outwardly.

| Layer | Thickness (Å) |
|---|---|
| Glass | |
| $TiO_x$ | 140 Å |
| $SnO_x$ | 100 Å |
| $ZnAlO_x$ | 70 Å |
| Ag | 118 Å |
| $NiCrO_x$ | 20 Å |
| $SnO_x$ | 223 Å |
| $SiN_x$ | 160 Å |

As is typically the case, the silver (Ag) layer was formed by sputtering a planar silver target in an atmosphere including only argon (Ar) gas. The silver (Ag) layer of the above coated article has a thickness of 118 angstroms (Å) and a sheet resistance ($R_S$) of 4.6 ohms/square. This translates into a specific resistivity ($R_S$ multiplied by thickness of the IR reflecting layer) for the silver IR reflecting layer of 5.43 micro-ohms.cm.

While the aforesaid specific resistivity (SR) of the silver IR reflecting layer is adequate in many situations, it would be desirable to improve upon the same. For example, if the specific resistivity (SR) of the silver layer could be lowered, then the coating could realize improved thermal properties (e.g., lower U-value, lower emittance, and/or the like) given an IR reflecting layer of the same thickness. Thus, a lower specific resistance of the IR reflecting layer(s), and thus a lower $R_S$ and emittance/emissivity are desirable, as they permits thermal properties of the coating to be improved.

In view of the above, it will be appreciated that reduced emittance, reduced sheet resistance, and reduced specific resistance are often desired properties in certain coated articles. Certain example embodiments of this invention seek to provide a method and/or system for making coated articles which permits the coated articles to have reduced emittance and/or resistance values.

In certain example embodiments of this invention, it has surprisingly been found that the use of krypton (Kr) gas in the sputter chamber when sputter-depositing an IR reflecting layer of or including silver unexpectedly improves the quality of the IR reflecting layer thereby permitting the coated article to realize improved thermal properties with a given thickness of the IR reflecting layer.

In particular, in certain example embodiments of this invention, it has been found that the use of at least Kr gas in the sputtering process of the IR reflecting layer unexpectedly results in an IR reflecting layer with a lower specific resistivity (SR). The lower the SR of an IR reflecting layer, the lower the emittance of the coated article with an IR reflecting layer of a given thickness. Likewise, the lower the SR of an IR reflecting layer, the lower the U-value of an IG unit including a similar coating having an IR reflecting layer of a given thickness. Thus, lowering the SR of an IR reflecting layer permits thermal properties of a coated article to be improved given an IR reflecting layer(s) of like thickness. Alternatively, lowering the SR of an IR reflecting layer permits thermal properties of a coated article to remain substantially the same while reducing the thickness of the IR reflecting layer(s) which may be desirable for increasing visible transmission or the like in certain situations.

Thus, it can be seen that lowering the SR of an IR reflecting layer is advantageous. As discussed herein, it has been found that the use of at least Kr gas in the sputtering process for the IR reflecting layer(s) surprisingly results in an IR reflecting layer(s) with a lower SR.

In certain example embodiments of this invention, there is provided a method of making a coated article for use in a window unit, the method comprising: providing a glass substrate for supporting a multi-layer coating; and depositing an infrared (IR) reflecting layer comprising silver on the glass substrate, wherein said depositing of the IR reflecting layer comprises sputtering at least one target comprising silver that is located in a chamber; providing at least krypton gas in the chamber during said sputtering of the target comprising silver.

In other example embodiments of this invention, there is provided a method of making a coated article including a layer comprising silver, the method comprising: sputtering at least one target comprising silver that is located in a chamber; and providing at least krypton gas in the chamber during said sputtering of the target comprising silver.

In still further example embodiments of this invention, there is provided a coated article including a coating supported by a glass substrate, the coating comprising: at least one infrared (IR) reflecting layer comprising silver located between at least first and second dielectric layers; and wherein the IR reflecting layer further comprises krypton.

BRIEF DESCRIPTION OF THE DRAWINGS

FIG. 7 is a table illustrating data from numerous examples according to certain example embodiments of this invention.

DETAILED DESCRIPTION OF EXAMPLE EMBODIMENTS OF THE INVENTION

Figure 1:
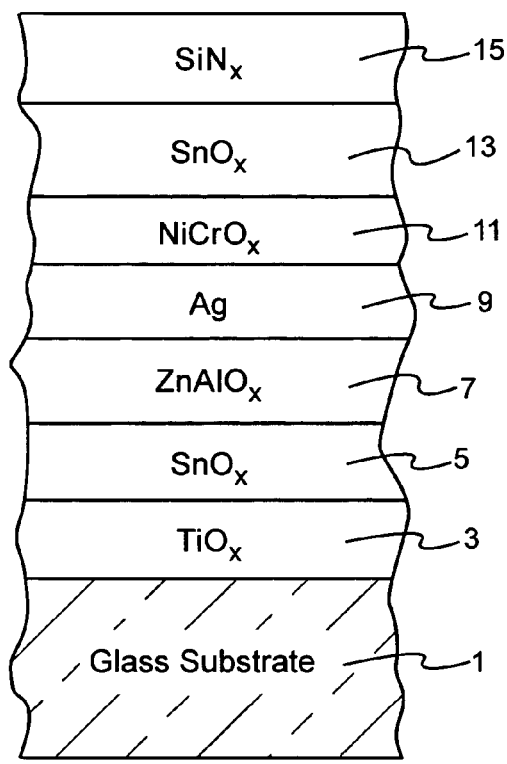
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units, vehicle windows, and/or any other suitable application that includes single or multiple substrates such as glass substrates. Coated articles according to different embodiments of this inventions may or may not be heat treated (e.g., thermally tempered).

In certain example embodiments of this invention, it has surprisingly been found that the use of krypton (Kr) gas in the sputter chamber when sputter-depositing an IR reflecting layer of or including silver unexpectedly improves the quality of the IR reflecting layer thereby permitting the coated article to realize improved thermal properties with a given thickness of the IR reflecting layer.

In particular, in certain example embodiments of this invention, it has been found that the use of at least Kr gas in the sputtering process of the IR reflecting layer unexpectedly results in an IR reflecting layer with a lower specific resistivity (SR). The lower the SR of an IR reflecting layer, the lower the emittance of the coated article with an IR reflecting layer of a given thickness. Likewise, the lower the SR of an IR reflecting layer, the lower the U-value of an IG unit including a similar coating having an IR reflecting layer of a given thickness. Thus, lowering the SR of an IR reflecting layer permits thermal properties of a coated article to be improved given an IR reflecting layer(s) of like thickness. Alternatively, lowering the SR of an IR reflecting layer permits thermal properties of a coated article to remain substantially the same while reducing the thickness of the IR reflecting layer(s) which may be desirable for increasing visible transmission or the like in certain situations.

Conventionally, argon (Ar) gas alone was used to silver (Ag) sputtering to form IR reflecting layers in low-E coatings. However, as explained herein, unexpectedly advantageous results have been found to occur when Kr gas is used either alone or in combination with an inert gas such as Ar or the like when sputtering Ag to form IR reflecting layers. The relative atomic masses of Ar and Kr are about 40 and 83, respectively. It is believed that the use of Kr is advantageous with respect to silver sputtering because Kr with a higher mass than Ar transfers more energy at the collision with the silver target, thereby causing not only single Ag atoms to be released from the target but also causing clusters consisting of several Ag atoms to be released from the silver target so that they can then move toward the substrate to form the silver-based IR reflecting layer. It has been found that depositing clusters on the substrate when forming the IR reflecting layer results in the generation of stable seeds for nucleation growth of the IR reflecting layer; and this leads to a more evenly or substantially uniform distribution of material for the IR reflecting layer thereby allowing a continuous IR reflecting layer to be formed either quicker or at a lower thickness.

In certain example embodiments of this invention, the IR reflecting layer 9 (e.g., silver layer) has a specific resistivity (SR) of no greater than 5.0, more preferably no greater than 4.5, more preferably no greater than 4.0, even more preferably no greater than 3.9, and most preferably no greater than 3.8, and sometimes no greater than 3.7 micro-ohms.cm. Such low SR values permit U-values and emittance of the coating to be lowered given a particular thickness for the IR reflecting layer(s). It has been found that such low SR values may be achieved through the use of krypton (Kr) gas in the sputtering chamber(s) (often in combination with another gas or gases such as Ar) when the silver inclusive IR reflecting layer is being sputter-deposited. A better more conductive IR reflecting layer has a lower SR, and SR is a good indicator of the quality of an IR reflecting layer.

In certain example embodiments of this invention, the use of Kr in sputtering the silver inclusive IR reflecting layer causes the SR of the IR reflecting layer to drop at least 5%, more preferably at least 10%, even more preferably at least 12%, still more preferably at least 14%, and most preferably at least 15% (compared to if only Ar was used in sputter-depositing the IR reflecting layer).

Figure 2:
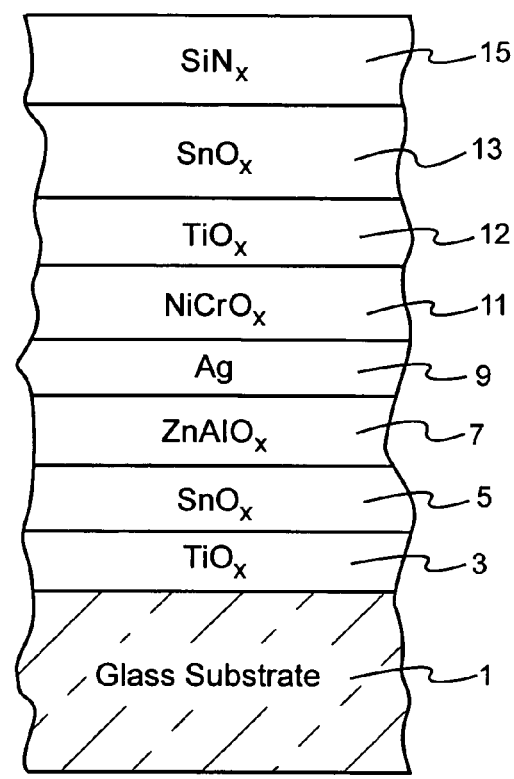
FIG. 2 is a cross sectional view of a coated article according to another example embodiment of this invention.

The coated articles shown in FIGS. 1-2 are provided for purposes of example only, and are not intended to be limiting. Thus, it will be appreciated that the use of Kr in sputtering an IR reflecting layer(s) may be used in connection with any other suitable coating in other embodiments of this invention. The coated articles of FIGS. 1-2 are not intended to be limiting, and are only provided for purposes of understanding. For instance, the instant invention may also be used in connection with double-silver coatings, or any other suitable coating which includes one or more IR reflecting layer(s). In double silver coatings, one or both of the silver layers may be depositing using at least krypton gas in the silver target's sputtering chamber.

FIGS. 1-2 are cross sectional views of different coated articles according to example embodiments of this invention. The coated articles include glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIGS. 1-2, the coatings may comprise dielectric layer 3, dielectric layer 5, zinc oxide inclusive layer 7, IR reflecting layer 9 including or of silver or the like, upper contact layer 11 of or including an oxide of nickel chrome (e.g., $NiCrO_x$), optionally a layer 12 consisting of or comprising titanium oxide ($TiO_x$) (see FIG. 2 embodiment), a metal oxide inclusive layer 13, and dielectric layer 15 of or including a material such as silicon nitride and/or silicon oxynitride which may in certain example instances be a protective overcoat. Other layers and/or materials may also be provided in certain example embodiments of this invention, and it is also possible that certain layers may be removed or split in certain example instances.

In monolithic instances, the coated article includes only one substrate such as glass substrate 1 (see FIGS. 1-2). However, monolithic coated articles herein may be used in devices such as IG window units for example. Typically, an IG window unit may include two spaced apart substrates with a gap defined therebetween. Example IG window units are illustrated and described, for example, in U.S. Pat. Nos. 5,770,321, 5,800,933, 6,524,714, 6,541,084 and U.S. Pat. No. 2003/0150711, the disclosures of which are all hereby incorporated herein by reference. An example IG window unit may include, for example, the coated glass substrate 1 shown in FIG. 1 or FIG. 2 coupled to another glass substrate (not shown) via spacer(s), sealant(s) or the like with a gap being defined therebetween. This gap between the substrates in IG unit embodiments may in certain instances be filled with a gas such as argon (Ar) or the like. An example IG unit may comprise a pair of spaced apart substantially clear glass substrates each about 4 mm thick one of which is coated with a low-E coating described herein in certain example instances, where the gap between the substrates may be from about 5 to 30 mm, more preferably from about 10 to 20 mm, and most preferably about 16 mm. In certain example instances, the low-E coating may be provided on the side of the inner glass substrate 1 facing the gap (although the coating may be on the other substrate in certain alternative embodiments). In certain example IG unit embodiments of this invention, the low-E coating is designed such that the resulting IG unit (e.g., with, for reference purposes, a pair of 4 mm clear glass substrates spaced apart by 16 mm with Ar gas in the gap) has a U-value of no greater than 1.25 W/(m²K), more preferably no greater than 1.20 W/(m²K), even more preferably no greater than 1.15 W/(m²K), and most preferably no greater than 1.10 W/(m²K). U-value is measured in accordance with EN 673, the disclosure of which is hereby incorporated herein by reference.

Referring to FIGS. 1-2, the bottom dielectric layer 3 may be of or include titanium oxide in certain example embodiments of this invention. The titanium oxide of layer 3 may in certain example instances be represented by $TiO_x$, where x is from 1.5 to 2.5, most preferably about 2.0. The titanium oxide may be deposited via sputtering or the like in different embodiments. In certain example instances, dielectric layer 3 may have an index of refraction (n), at 550 nm, of at least 2.0, more preferably of at least 2.1, and possibly from about 2.3 to 2.6 when the layer is of or includes titanium oxide. In certain embodiments of this invention, the thickness of titanium oxide inclusive layer 3 is controlled so as to allow a* and/or b* color values (e.g., transmissive, film side reflective, and/or glass side reflective) to be fairly neutral (i.e., close to zero) and/or desirable. Other materials may be used in addition to or instead of titanium oxide in certain example instances. In certain alternative embodiments, the Ti in oxide layer 3 may be replaced with another metal.

Dielectric layer 5 is optional, and may be of or include a metal oxide such as tin oxide in certain example embodiments of this invention. Metal oxide inclusive layer 5 may be provided in order to improve adhesion between titanium oxide layer 3 and zinc oxide layer 7 in certain example embodiments. The tin oxide layer 5 may be doped with other materials such as nitrogen in certain example embodiments of this invention. In certain instances, tin oxide inclusive layer 5 may be advantageous in that it may increase the throughput of the coater producing the coating or save costs, compared to if this portion of the coating was of titanium oxide or silicon nitride which are slower to sputter and/or more expensive (although these materials are also possible).

Lower contact layer 7 in certain embodiments of this invention is of or includes zinc oxide (e.g., ZnO). The zinc oxide of layer 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer may, however, be slightly oxidized in certain embodiments of this invention. Since at least Kr gas is used in sputter-depositing the IR reflecting layer 9 comprising silver in certain example embodiments of this invention, the resulting IR reflecting layer may include krypton in addition to silver. In certain example embodiments of this invention, the IR reflecting layer 9, in addition to including silver, comprises from about 0.01 to 2% krypton, more preferably from about 0.1 to 2% krypton, and sometimes from about 0.2 to 1.5% krypton (atomic percent).

In certain example embodiments of this invention, the target-to-substrate distance of the silver target (e.g., silver planar target) used in sputtering IR reflecting layer 9 is reduced compared to conventional practice. Surprisingly and unexpectedly, it has been found that properties of the IR reflecting layer 9 can be improved by reducing the distance between the substrate 1 and the sputtering target(s) used in forming the IR reflecting layer(s) 9. For example, it has been found that a reduction in the target-substrate distance for a target(s) used in sputtering an IR reflecting layer(s) 9 results in an IR reflecting layer 9 having one or more of: (a) reduced sheet resistance ($R_S$) given a common layer thickness, (b) reduced emittance or emissivity, (c) improved crystallinity, and/or (d) a higher and thus improved extinction coefficient (k). Accordingly, in certain example embodiments of this invention, IR reflecting layer(s) 9 are formed by sputtering a target which is located closer to the substrate 1 than conventionally. In certain example embodiments of this invention, IR reflecting layer(s) 9 is/are formed by sputtering where the Ag target being sputtering is located in accordance with a target-substrate distance of less than or equal to about 110 mm, more preferably less than or equal to about 100 mm, more preferably less than or equal to about 95 mm, still more preferably less than or equal to about 90 mm, even more preferably less than or equal to about 80 mm. Further details of the target-to-substrate distance for the silver target used in forming IR reflecting layer 9 are discussed in U.S. Provisional Patent Application No. 60/619,687, the disclosure of which is hereby incorporated herein by reference.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide (NiCrO$_x$), or other suitable material(s). The use of, for example, NiCrO$_x$ in this layer allows durability to be improved. The NiCrO$_x$ layer 11 may be fully oxidized in certain embodiments of this invention (i.e., fully stoichiometric), or alternatively may only be partially oxidized. In certain instances, the NiCrO$_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer.

Optional titanium oxide layer 12 is provided on and over the IR reflecting layer 9, and directly on and contacting the contact layer 11 in the FIG. 2 embodiment. It has unexpectedly been found that the provision of a layer 12 consisting essentially of or comprising titanium oxide over IR reflecting layer 9 unexpectedly improves the quality of the IR reflecting layer thereby permitting the coated article to realized improved thermal and/or optical properties in certain example embodiments. The titanium oxide layer 12 may be stoichiometric (TiO$_2$) or non-stoichiometric in different embodiments of this invention. In certain example embodiments, the layer may be of or include titanium oxide (e.g., TiO$_x$, where x may be from about 1.5 to 2.5, more preferably from about 1.65 to 2, even more preferably from about 1.75 to 2, or any other suitable value). Another example advantage of the provision of the titanium oxide inclusive layer 12 over the IR reflecting layer is that it permits antireflection characteristics of the coated article to be improved, which results in a higher visible transmission through the coating. Thus, the titanium oxide layer also permits visible transmission to be increased in certain example embodiments, and/or permits a thicker silver-based IR reflecting layer to be used without sacrificing visible transmission, in certain example embodiments of this invention. In certain example embodiments, the titanium oxide layer may be provided over the IR reflecting layer, and may be located between (a) a first layer comprising an oxide of Ni and/or Cr, and (b) a second layer comprising a metal oxide such as tin oxide or alternatively a layer comprising silicon oxynitride and/or silicon nitride. In certain example embodiments of this invention, the provision of the titanium oxide layer over the IR reflecting layer surprisingly results in an IR reflecting layer with a lower specific resistivity (SR).

Referring to FIGS. 1-2, dielectric layer 13 may be of or include a metal oxide such as tin oxide in certain example embodiments of this invention. Metal oxide inclusive layer 13 is provided for antireflection purposes, and also improves the emissivity of the coated article and the stability and efficiency of the manufacturing process. Moreover, tin oxide in layer 13 provides good adhesion to the titanium oxide in layer 12, and provides for good durability in this respect. The tin oxide layer 13 may be doped with other materials such as nitrogen in certain example embodiments of this invention. In certain instances, tin oxide inclusive layer 5 may be advantageous in that it may increase the throughput of the coater producing the coating or save costs, compared to if this portion of the coating was of titanium oxide or silicon nitride which are slower to sputter and/or more expensive (although these materials are also possible to replace the layer 13).

Dielectric layer 15, which may be an overcoat in certain example instances, may be of or include silicon nitride (e.g., Si$_3$N$_4$) or any other suitable material in certain example embodiments of this invention such as silicon oxynitride. Optionally, other layers may be provided above layer 15. Layer 15 is provided for durability purposes, and to protect the underlying layers. In certain example embodiments, layer 15 may have an index of refraction (n) of from about 1.9 to 2.2, more preferably from about 1.95 to 2.05.

Other layer(s) below or above the illustrated coatings may also be provided. Thus, while the layer system or coating in each figure is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, layer 5 and/or layer 13 may be removed in certain example situations.

While various thicknesses may be used in different embodiments of this invention, example thicknesses and materials for the respective layers on the glass substrate 1 in the FIG. 2 embodiment are as follows, from the glass substrate outwardly (e.g., the Al content in the zinc oxide layer 7 may be from about 1-10%, more preferably from about 1-3% in certain example instances):

TABLE 1

(Example Materials/Thicknesses; FIG. 2 Embodiment)

| Layer | Preferred Range (Å) | More Preferred (Å) | Example (Å) |
|---|---|---|---|
| TiO$_x$ (layer 3) | 30-400 Å | 80-250 Å | 180 Å |
| SnO$_2$ (layer 5) | 10-300 Å | 10-100 Å | 20 Å |
| ZnAlO$_x$ (layer 7) | 10-300 Å | 60-120 Å | 50 Å |
| Ag (layer 9) | 50-250 Å | 80-150 Å | 130 Å |
| NiCrO$_x$ (layer 11) | 10-80 Å | 20-70 Å | 30 Å |

TABLE 1-continued (Example Materials/Thicknesses; FIG. 2 Embodiment)

| Layer | Preferred Range (Å) | More Preferred (Å) | Example (Å) |
|---|---|---|---|
| $TiO_x$ (layer 12) | 10-300 Å | 20-100 Å | 40 Å |
| $SnO_2$ (layer 13) | 40-400 Å | 100-200 Å | 160 Å |
| $Si_3N_4$ (layer 15) | 50-750 Å | 150-350 Å | 210 Å |

In certain example embodiments of this invention, coated articles herein may have the following low-E (low emissivity), solar and/or optical characteristics set forth in Table 2 when measured monolithically. The specific resistivity (SR) and sheet resistance ($R_S$) are of the silver based IR reflecting layer 9.

TABLE 2

Low-E/Solar Characteristics (Monolithic; no HT)

| Characteristic | General | More Preferred | Most Preferred |
|---|---|---|---|
| $R_s$ (ohms/sq.): | <=5.0 | <=4.0 | <=3.0 |
| SR of Ag (microohms · cm): | <=4.5 | <=4.0 | <=3.8 |
| $E_n$: | <=0.10 | <=0.06 | <=0.040 |
| $T_{vis}$ (%): | >=40 | >=70 | >=80 |

In certain example embodiments, a single lite according to example embodiments may have a sheet resistance of no greater than 4.5 ohms/square (more preferably no greater than 3.3 ohms/square), a normal emittance/emissivity of no greater than 0.049 (more preferably no greater than 0.035), and a visible transmission of at least about 87%. An IG unit including the lite would have a reduced visible transmission, such as at least 80%.

It can be seen from the above that the coated article has a reduced (i.e., better) SR for the silver IR reflecting layer 9 compared to the 5.43 micro-ohms.cm value mentioned above where no Kr is used in sputtering of the Ag and the titanium oxide layer 12 is not present. Thus, it can be seen that the use of Kr in sputtering of the silver, and/or the presence of the titanium oxide layer 12, surprisingly result in improved specific resistivity of the IR reflecting layer, and thus improved thermal properties.

Moreover, coated articles including coatings according to certain example embodiments of this invention may have the following optical characteristics (e.g., when the coating(s) is provided on a clear soda lime silica glass substrate 1 from 1 to 10 mm thick, preferably about 4 mm thick). In Table 3, all parameters are measured monolithically.

TABLE 3

Example Optical Characteristics (Monolithic)

| Characteristic | General | More Preferred |
|---|---|---|
| $T_{vis}$ (or TY)(Ill. C, 2 deg.): | >=70% | >=80% (or >=85%) |
| $a*_t$ (Ill. C, 2°): | −2.5 to +1.0 | −2.0 to 0.0 |
| $b*_t$ (Ill. C, 2°): | −1.0 to +4.0 | 0.0 to 2.5 |
| $L*_t$: | >=90 | >=93 |
| $R_fY$ (Ill. C, 2 deg.): | 1 to 7% | 1 to 6% |
| $a*_f$ (Ill. C, 2°): | −5.0 to +4.0 | −1.5 to +3.0 |
| $b*_f$ (Ill. C, 2°): | −14.0 to +10.0 | −10.0 to 0 |
| $L*_f$: | 22-30 | 24-27 |
| $R_gY$ (Ill. C, 2 deg.): | 1 to 10% | 1 to 9% |
| $a*_g$ (Ill. C, 2°): | −5.0 to +4.0 | −1.5 to +3.0 |
| $b*_g$ (Ill. C, 2°): | −14.0 to +10.0 | −10.0 to 0 |

TABLE 3-continued

Example Optical Characteristics (Monolithic)

| Characteristic | General | More Preferred |
|---|---|---|
| $L*_g$: | 27-36 | 30-35 |

Moreover, coated articles including coatings according to certain example embodiments of this invention have the following optical characteristics when the coated article is an IG unit in certain example embodiments (e.g., for purposes of reference, when the coating is provided on a clear soda lime silica glass substrate 1 from 1 to 10 mm thick, preferably about 4 mm thick) on surface #3 of an IG window unit. It is noted that U-value is measured in accordance with EN 673.

TABLE 4

Example Optical Characteristics (IG Unit)

| Characteristic | General | More Preferred |
|---|---|---|
| $T_{vis}$ (or TY)(Ill. C, 2 deg.): | >=70% | >=78% |
| $a*_t$ (Ill. C, 2°): | −4.0 to +1.0 | −3.0 to 0.0 |
| $b*_t$ (Ill. C, 2°): | −1.0 to +4.0 | 0.0 to 3.0 |
| $R_{outside}Y$ (Ill. C, 2 deg.): | <=14% | <=12% |
| $a*_{out}$ (Ill. C, 2°): | −3.0 to +3.0 | −2 to +2.0 |
| $b*_{out}$ (Ill. C, 2°): | −10.0 to +10.0 | −6.0 to 0 |
| $R_{inside}Y$ (Ill. C, 2 deg.): | <=14% | <=12% |
| $a*_{inside}$ (Ill. C, 2°): | −5.0 to +4.0 | −1.5 to +3.0 |
| $b*_{inside}$ (Ill. C, 2°): | −14.0 to +10.0 | −10.0 to 0 |
| U-value (IG)(W/($m^2$K)): | <=1.25 | <=1.15 (or <=1.10) |

In certain example embodiments of this invention, the titanium oxide layer 12 over the IR reflecting layer may be oxidation graded. In certain example embodiments, the titanium oxide layer 12 may be more oxided at a location further from the IR reflecting layer 9 than at a location closer to the IR reflecting layer 9. Surprisingly, this has been found to improve the adhesion of the titanium oxide layer 12 to the underlying layer such as a layer comprising $NiCrO_x$ 11 or silver 9. In other example embodiments of this invention, the titanium oxide 12 layer may be more oxided at a location proximate a central portion of the layer than at respective locations closer to the upper and lower surfaces of the layer 12. Again, this has been found to improve the adhesion of the layer 12 comprising titanium oxide to the layers below (9 or 11) and above (13) the titanium oxide layer 12. Further details are discussed in No. 60/625,164, incorporated herein by reference.

FIGS. 3-6 are graphs which illustrate the surprising results associated with the use of Kr in sputtering Ag for the IR reflecting layer 9. Each of these graphs, namely FIGS. 3-6, illustrates that improved results (e.g., lower specific resistance, lower emissivity, or lower sheet resistance) are achieved when Kr gas is used in the process of sputtering the Ag target for the IR reflecting layer 9. FIGS. 3-6 will be discussed below in more detail with respect to certain examples of this invention.

EXAMPLES

The following examples are provided for purposes of example only, and are not intended to be limiting.

The table in FIG. 7 sets forth thirty-one (31) example silver IR reflecting layers 9 that were made using different process parameters. In FIG. 7, the "flow" columns represent gas flows of Ar and/or Kr as indicated in units of sccm in the chamber where the silver target was sputtered to form the silver IR reflecting layer, the "total silver flow" column represents the total combined gas flows of Ar and Kr used in sputtering the silver IR reflecting layer, the "silver thickness" column represents the thickness of the sputter-deposited silver IR reflecting layer in units of angstroms (Å), the $R_S$ resistance column indicates sheet resistance of the silver IR reflecting layer in units of ohms/square, the "tin present" column indicates whether tin oxide layer 5 was present in the FIG. 1 stack, and the L*, a* and b* film side color/lightness values are indicative of these values as measured on the resulting stack having layers as shown in FIG. 1.

It can be seen in the table of FIG. 7 that the silver IR reflecting layers 9 sputter-deposited using only Ar gas in the sputter chamber or bay (e.g., examples 1.0, 1.1, 1.2, 1.5, 1.6, 1.9, 1.14 and 2.7-2.11 in FIG. 7) had relatively high specific resistance (SR) values; all of at least 4.06 micro-ohms.cm where available. However, it can also be seen that the use of Kr gas in sputtering the silver resulted in significantly reduced SR values for the sputter-deposited silver layers. For instance, in example, in Example 1.7 where 150 sccm Kr gas was used in sputtering the Ag IR reflecting layer 9, the SR of the IR reflecting layer 9 dropped to 3.5 micro-ohms.cm (this represents a drop in SR of at least about 14%). In examples 1.3, 1.8, 1.11, 1.12, 1.13, 1.15, 2.1 and 2.12 where Kr gas was used in sputter the Ag IR reflecting layer 9, the SR of the IR reflecting layer dropped to 3.71, 3.76, 3.60, 3.85, 3.69, 3.56, 3.69, and 3.64 micro-ohms.cm, respectively. Each of these represents a significant and unexpected advantageous drop in SR of the IR reflecting layer 9 due to the use of Kr in sputter-depositing the IR reflecting layer. Thus, it can be seen that the use of Kr in sputter-depositing the silver inclusive IR reflecting layer surprisingly results in a significant drop in SR (and thus sheet resistance for a given thickness) of the IR reflecting layer, which is highly desirable.

Figure 3:
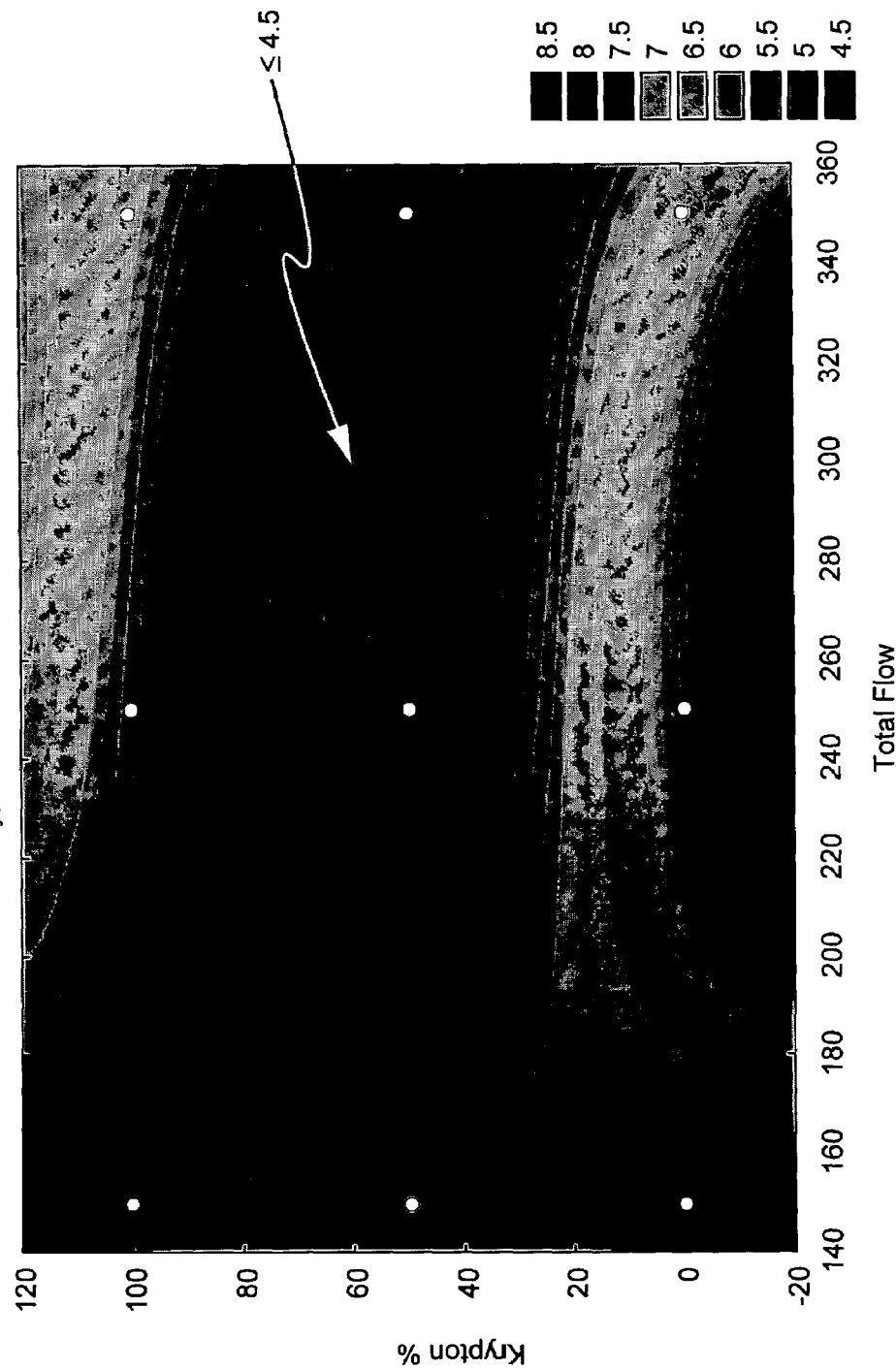
FIG. 3 is a graph plotting emissivity (or emittance) of an IR reflecting layer as a function of the percentage of krypton gas used in sputtering of the silver inclusive IR reflecting layer, according to example embodiments of this invention.

FIG. 3 is a graph plotting emissivity (or emittance) of an IR reflecting layer 9 as a function of the percentage of krypton gas used in sputtering of the silver inclusive IR reflecting layer, for certain of the examples listed in FIG. 7 in the context of the FIG. 1 layer stack. The white dots in FIG. 3 (and FIG. 4) indicate example data points. The "X" shown in the FIG. 3 graph indicates the area of lowest emissivity. The region where this "X" is present indicates a Kr gas flow that represents about 55-75% (more preferably about 70%) of the total gas flow in the silver sputtering chamber or bay (the remainder of the gas flow is Ar). Thus, it will be appreciated that excellent results may be achieved using a combination of at least Kr and Ar gas in the silver target sputtering chamber when sputter-depositing a silver based IR reflecting layer according to certain example embodiments of this invention.

Accordingly, in certain example embodiments of this invention, from about 40-100% of the total gas flow in the chamber including the silver target(s) for sputter-depositing the IR reflecting layer is Kr, more preferably from about 50-90% of the total gas flow is Kr, and most preferably from about 55-85%, most preferably from about 70-80% of the total gas flow is Kr (with part or all of the remainder of the gas flow being of an inert gas such as Ar, or the like).

Figure 4:
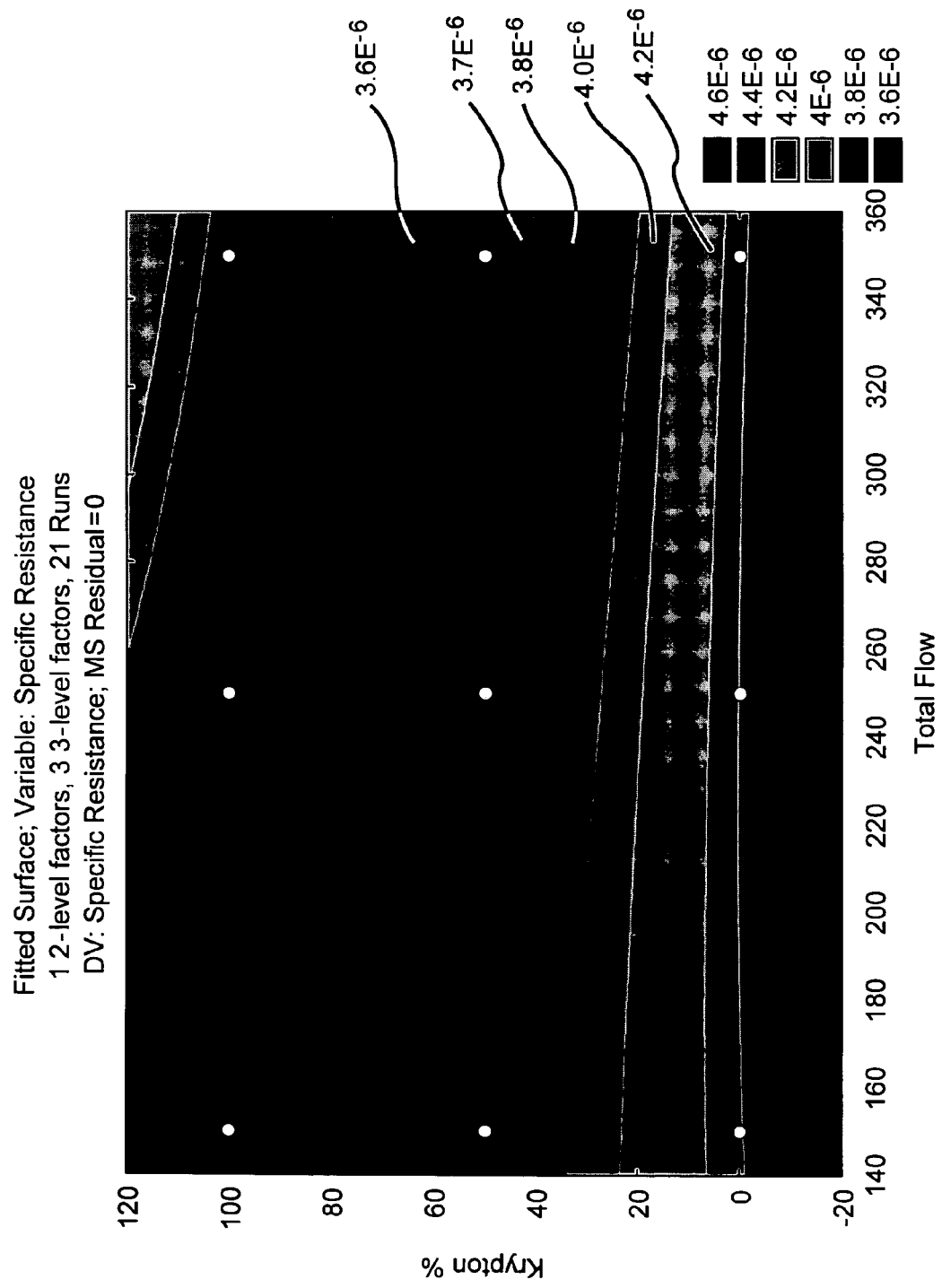
FIG. 4 is a graph plotting specific resistance (SR) of an IR reflecting layer as a function of the percentage of krypton gas used in sputtering of the silver inclusive IR reflecting layer, according to example embodiments of this invention.

FIG. 4 is a graph plotting specific resistance (SR) of an IR reflecting layer 9 as a function of the percentage of Kr gas used in sputtering of the silver inclusive IR reflecting layer 9, for certain of the examples listed in FIG. 7 in the context of the FIG. 1 layer stack. As shown in FIG. 4, the SR is largely independent of total gas flow, but is highly dependent on the level of Kr used during sputtering of the Ag target. The optimal level of Kr is around 70-80% of the total gas flow where the total flow dependence is minimized. At this level, a SR of 3.7 micro-ohms.cm, or less, can be achieved. This indicates that a relatively robust process can be used with from about 55-85%, more preferably 70-80%, of Kr gas flow (with all or part of the remainder of the total gas flow in the Ag target chamber/bay being of Ar or the like) in order to optimize SR, and thus sheet resistance and emissivity of the coated article.

Figure 5:
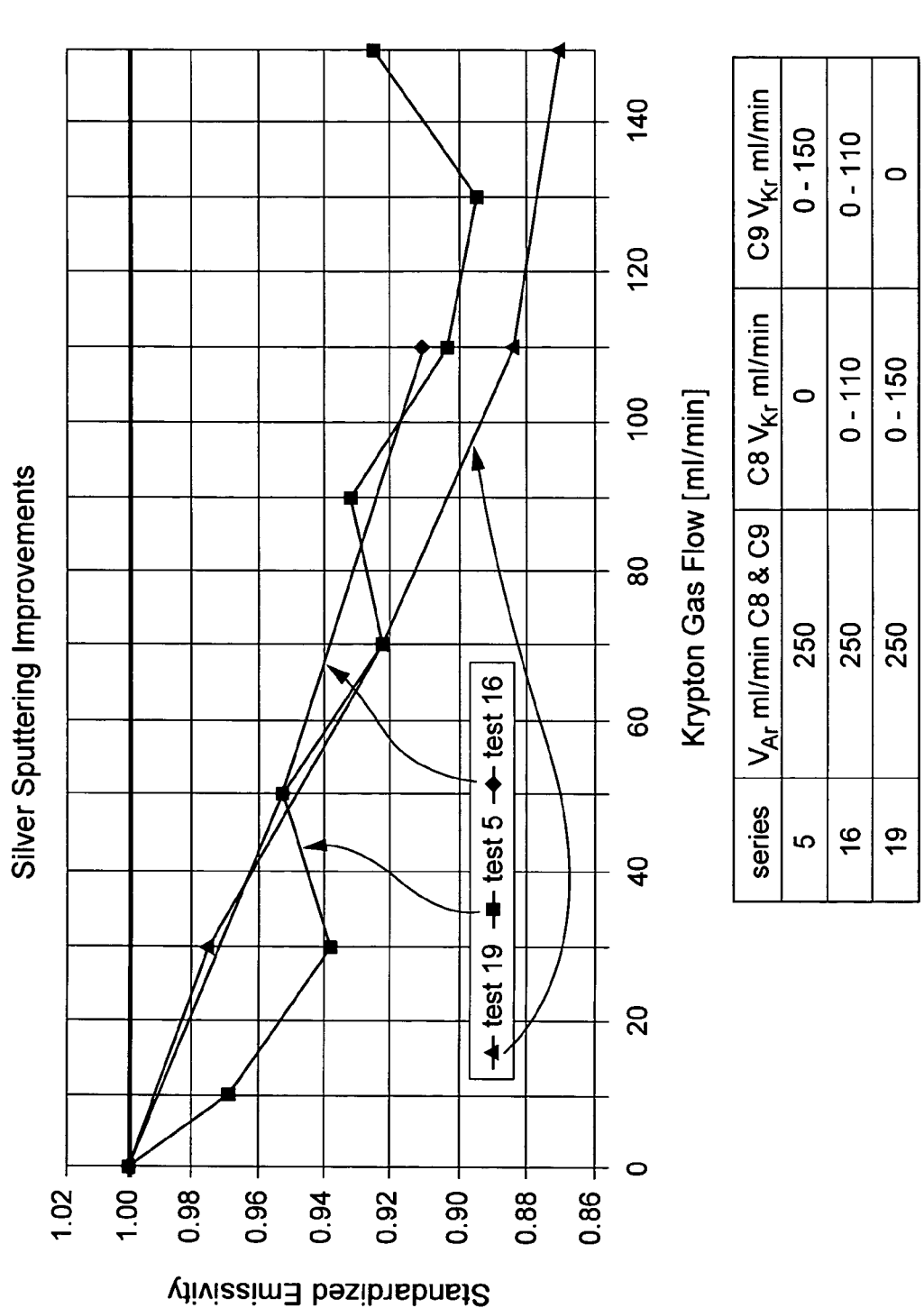
FIG. 5 is a graph plotting standard emissivity of an IR reflecting layer as a function of the krypton gas used in sputtering of the silver inclusive IR reflecting layer, according to example embodiments of this invention.

FIG. 5 is a graph plotting standard emissivity of an IR reflecting layer as a function of the krypton gas used in sputtering of the silver inclusive IR reflecting layer, according to different examples of this invention. Again, it can be seen from the data in FIG. 5 that the use of Kr gas in sputter-depositing the Ag IR reflecting layer results in improved (i.e., lower) emissivity values for the coating.

Figure 6:
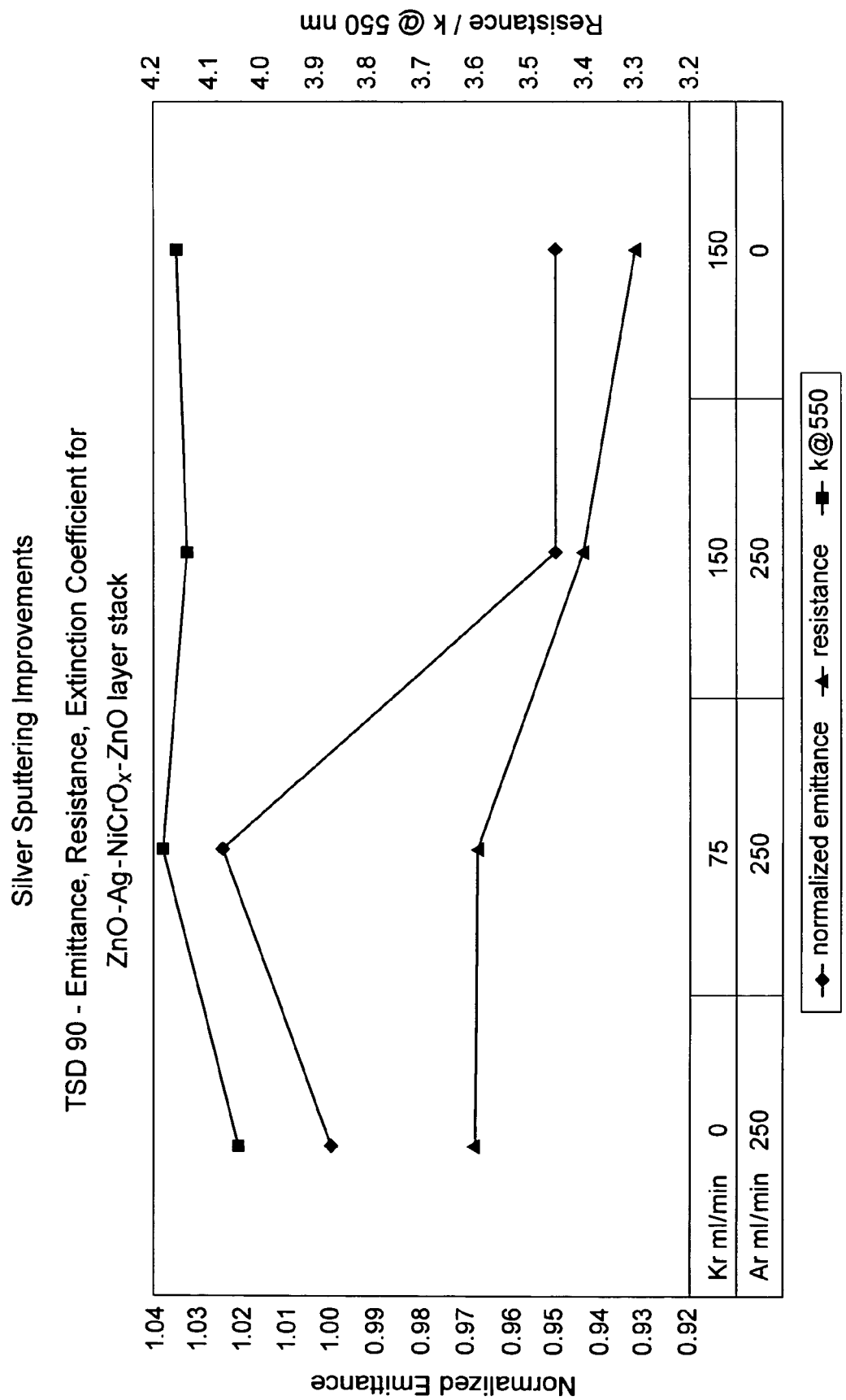
FIG. 6 is a graph plotting normalized emittance/emissivity and sheet resistance ($R_S$) of an IR reflecting layer as a function of krypton gas used in sputtering of the silver inclusive IR reflecting layer, according to example embodiments of this invention.

FIG. 6 is a graph plotting normalized emittance/emissivity and sheet resistance ($R_S$) of a silver IR reflecting layer as a function of krypton gas used in sputtering of the silver inclusive IR reflecting layer, according to examples of this invention where the layer stack was ZnO/Ag/NiCrOx/ZnO (different from the layers stacks discussed above) The target-to-substrate distance (TSD) for the data of FIG. 6 was about 90 mm. Again, it can be seen from the data in FIG. 6 that the use of Kr gas in sputter-depositing the Ag IR reflecting layer results in improved (i.e., lower) emittance and sheet resistance ($R_S$) values for the IR reflecting layer and thus the coating.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article for use in a window unit, the method comprising:
   providing a glass substrate for supporting a multi-layer coating;
   depositing an infrared (IR) reflecting layer comprising silver on the glass substrate, wherein said depositing of the IR reflecting layer comprises sputtering at least one target comprising silver that is located in a chamber; providing at least krypton gas in the chamber during said sputtering of the target comprising silver; and
   wherein a mixture of krypton and at least another inert gas are provided in the chamber during sputtering of the target comprising silver, and wherein from about 55-85% of total gas flow in the chamber during sputtering of the target comprising silver is made up of krypton gas, and wherein substantially a remainder of the total gas flow includes another gas which is the at least another inert gas.

2. The method of claim 1, wherein the another inert gas comprises argon gas.

3. The method of claim 1, wherein the IR reflecting layer comprising silver has a specific resistance (SR) of less than or equal to about 4.0 micro-ohms.cm.

4. The method of claim 1, wherein the IR reflecting layer comprising silver has a specific resistance (SR) of less than or equal to about 3.8 micro-ohms.cm.

5. The method of claim 1, wherein the IR reflecting layer comprising silver has a specific resistance (SR) of less than or equal to about 3.7 micro-ohms.cm.

6. The method of claim 1, wherein the use of krypton gas in depositing the IR reflecting layer causes a specific resistance of the IR reflecting layer to drop at least 5% compared to if no krypton gas was used during said depositing.

7. The method of claim 1, wherein the use of krypton gas in depositing the IR reflecting layer causes a specific resistance of the IR reflecting layer to drop at least 10% compared to if no krypton gas was used during said depositing.

8. The method of claim 1, wherein the use of krypton gas in depositing the IR reflecting layer causes a specific resistance of the IR reflecting layer to drop at least 14% compared to if no krypton gas was used during said depositing.

9. The method of claim 1, wherein the coated article has a visible transmission of at least 40%, and wherein the coating has a sheet resistance ($R_s$) of no greater than 5.0 ohms/square.

10. The method of claim 1, wherein the coated article has a visible transmission of at least 70%, and wherein the coating has a sheet resistance ($R_s$) of no greater than 4.0 ohms/square.

11. The method of claim 1, further comprising forming:
at least one dielectric layer located between the glass substrate and the IR reflecting layer;
a layer comprising an oxide of Ni and/or Cr located over and directly contacting the IR reflecting layer comprising silver;
a layer comprising titanium oxide located over and directly contacting the layer comprising the oxide of Ni and/or Cr;
a layer comprising a metal oxide located over and directly contacting the layer comprising titanium oxide; and
a layer comprising silicon nitride located over the layer comprising the metal oxide.

12. The method of claim 1, further comprising forming a layer comprising zinc oxide, and wherein the IR reflecting layer is located over and directly contacts the layer comprising zinc oxide.

13. The method of claim 1, further comprising coupling the glass substrate with the coating thereon to another substrate in order to form an insulating glass (IG) window unit, and wherein the IG window unit has a U-value of no greater than 1.15 W/($m^2$K).

14. The method of claim 1, wherein the coated article has an a* value of from −2.5 to +1, and a b* value of from −1 to +4.

15. A method of making a coated article including a layer comprising silver, the method comprising:
sputtering at least one target comprising silver that is located in a chamber;
providing at least krypton gas in the chamber during said sputtering of the target comprising silver; and
wherein a mixture of krypton and at least another inert gas are provided in the chamber during sputtering of the target comprising silver, and wherein from about 55-85% of total gas in the chamber during sputtering of the target comprising silver is made up of krypton gas, and wherein substantially a remainder of the total gas flow includes another gas which is the at least another inert gas.

16. The method of claim 15, wherein the another inert gas comprises argon gas.

* * * * *